(12) United States Patent
Yamamoto et al.

(10) Patent No.: US 6,440,576 B1
(45) Date of Patent: Aug. 27, 2002

(54) METAL PLATED AROMATIC POLYIMIDE FILM

(75) Inventors: Tomohiko Yamamoto, Ube; Jun Takagi, Ichihara; Hiroto Shimokawa, Ube, all of (JP)

(73) Assignee: Ube Industries, Ltd., Yamaguchi (JP)

( * ) Notice: Subject to any disclaimer, the term of this patent is extended or adjusted under 35 U.S.C. 154(b) by 0 days.

(21) Appl. No.: 09/497,247

(22) Filed: Feb. 3, 2000

(30) Foreign Application Priority Data

Feb. 3, 1999 (JP) .......................................... 11-025886

(51) Int. Cl.⁷ .............................................. B32B 27/06
(52) U.S. Cl. ................................ 428/473.5; 428/411.1; 428/457; 428/458; 428/221; 528/170; 528/353
(58) Field of Search ................................. 428/221, 457, 428/458, 473.5, 411.1; 528/170, 353

(56) References Cited

U.S. PATENT DOCUMENTS

| | | | | |
|---|---|---|---|---|
| 5,130,192 A | * | 7/1992 | Takabayashi et al. | 428/332 |
| 5,227,244 A | * | 7/1993 | Milligan | 428/458 |
| 5,543,222 A | * | 8/1996 | Edman et al. | 428/335 |
| 6,129,982 A | * | 10/2000 | Yamaguchi et al. | 428/336 |
| 6,194,076 B1 | * | 2/2001 | Matienzo et al. | 428/458 |
| 6,217,996 B1 | * | 4/2001 | Yamamoto et al. | 428/220 |
| 6,242,103 B1 | * | 6/2001 | Farnworth et al. | 428/458 |

FOREIGN PATENT DOCUMENTS

| | | | |
|---|---|---|---|
| JP | 4-02249640 A | * | 10/1990 |
| JP | 405114784 A | * | 5/1993 |
| JP | 408276534 A | * | 10/1996 |

* cited by examiner

*Primary Examiner*—P. Hampton-Hightower
(74) *Attorney, Agent, or Firm*—Reed Smith LLP

(57) ABSTRACT

A metal-plated aromatic polyimide film composed of an aromatic polyimide resin film, a surface layer of which contains a dispersed palladium metal or a palladium compound, and a metal layer which is chemically plated on the surface layer of the polyimide resin film. The surface layer is preferably formed by placing a palladium compound on a self-supporting aromatic polyimide precursor film and heating the self-supporting film having the palladium compound on its surface layer to a temperature at which the polyimide precursor is converted into its corresponding aromatic polyimide.

14 Claims, No Drawings

METAL PLATED AROMATIC POLYIMIDE FILM

FIELD OF THE INVENTION

The present invention relates to a metal-plated aromatic polyimide film in which the plated metal is fixed to the surface of the aromatic polyimide film with high bonding strength.

BACKGROUND OF THE INVENTION

An aromatic polyimide film shows high heat resistance as well as good electric characteristics, and are widely employed as material for producing various electronic devices. The aromatic polyimide film, however, has such a disadvantageous feature as poor adhesive property to an adhesive which is ordinarily employed for constituting electronic devices. Further, a metal film deposited on the aromatic polyimide film by sputtering shows poor adhesion to the polyimide film and is easily peeled off from the polyimide film. Therefore, studies for improving the poor adhesive property of an aromatic polyimide film have been made and reported.

U.S. Pat. No. 5,218,034 describes a polyimide film having improved adhesion and thermal durability containing from 0.02 to 1% by weight of tin based on the weight of the film.

U.S. Pat. No. 5,543,222 describes a vacuum metallized polyimide film comprising an aromatic polyimide layer containing a hydrocarbyl tin compound in oxidation state (II) or (IV) as an additive and metal plated layer bonded integrally with high bonding strength or high adhesion via a vacuum deposited metal layer without the use of an adhesive.

U.S. Pat. No. 5,272,194 describes a strengthened polyimide film having improved adhesion when bonded to a metal foil via a heat-resistant adhesive, containing from 0.02 to 1% by weight, based on the weight of the film, of an organo-metallic compound wherein the metal is tin, bismuth or antimony.

U.S. Pat. No. 5,227,244 describes a polyimide film having improved adhesion which is prepared by coating the surface of a partially cured or partially dried polyamide acid film with an organic solvent solution of a metal salt and heating the coated film to convert the polyamide acid to polyimide and dry the film. The metal salt is a salt of Sn, Zn, Cu, Fe, Co, Mn, or Pd. Thus treated surface can be combined with a copper metal foil via an acrylic resin adhesive.

Japanese Patent Provisional Publications 59-86634 and H2-134241 both describe that a polyimide film can be improved in its adhesion by plasma discharge processing.

Japanese Patent Provisional Publication H1-214840 describes a process for preparing a polyimide resin pattern which comprises the steps of forming a film of an aluminum alcoholate or a chelated aluminum compound on a film of polyimide or its precursor, coating a photoresist on the aluminum-compound layer, imagewise exposing the photoresist coat to light, and etching the light-exposed photoresist.

SUMMARY OF THE INVENTION

It is an object of the present invention to provide a metal-plated aromatic polyimide film in which a metal film is plated on the polyimide film with high strength bonding.

It is another object of the invention to provide a metal-plated aromatic polyimide film in which a metal film is plated on the polyimide film with high strength bonding which is produced easily in industry.

The present invention resides in metal-plated aromatic polyimide film comprising an aromatic polyimide resin film, a surface layer of which contains a palladium metal or a palladium compound dispersed therein, and a metal layer which is chemically plated on the surface layer of the polyimide resin film.

It is preferred that the metal-plated aromatic polyimide film of the invention further contains an aluminum metal or an aluminum compound in the surface layer of the aromatic polyimide resin film.

On the chemically plated metal-plated aromatic polyimide film of the invention, an electrolytically plated metal layer is easily formed.

The palladium metal- or palladium compound-containing surface layer of the polyimide film of the metal-plated aromatic polyimide film of the invention is preferably formed by placing a palladium compound on a self-supporting film of an aromatic polyimide precursor and heating the self-supporting film having the palladium compound thereon to a temperature such as 420° C. or higher, at which the polyimide precursor is converted into its corresponding aromatic polyimide.

The palladium metal- or palladium compound-containing surface layer of the polyimide film is also favorably formed by coating or spraying a solution of a palladium compound on a self-supporting film of an aromatic polyimide precursor and heating the self-supporting film having the palladium compound thereon to a temperature such as 420° C. or higher, at which the polyimide precursor is converted into its corresponding aromatic polyimide.

The palladium metal- or palladium compound-containing surface layer of the polyimide film is also favorably formed by extruding an aromatic polyimide precursor solution containing no palladium compound and an aromatic polyimide precursor solution containing a palladium compound simultaneously from a die and placing one extruded precursor solution on the other precursor solution to give a combined precursor solution film, and heating the precursor solution film to a temperature such as 420° C. or higher, at which the polyimide precursor is converted into its corresponding aromatic polyimide.

DETAILED DESCRIPTION OF THE INVENTION

In the metal-plated aromatic polyimide film of the invention, the plated metal film can be placed on one side or both sides of the polyimide film.

The polyimide film of the invention which has a surface layer containing a palladium metal or a palladium compound comprises a resin matrix of aromatic polyimide resin. The aromatic polyimide resin is preferably composed of an aromatic tetracarboxylic acid residue and an aromatic diamine residue. The aromatic tetracarboxylic acid residue is preferably derived from an aromatic tetracarboxylic dianhydride, and the aromatic diamine residue is preferably derived from an aromatic diamine. A small portion of the aromatic tetracarboxylic acid residue can be replaced with an aliphatic tetracarboxylic acid residue, and a small portion of the aromatic diamine residue can be replaced with an aliphatic diamine. The polyimide resin can contain an aminodicarboxylic acid residue such as 4-aminophthalic acid residue, 4-amino-5-methylphthalic acid residue, or 4-(3,3'dimethyl-4-anilino)phthalic acid residue, in addition to the aromatic tetracarboxylic acid residue and the aromatic diamine residue.

Examples of preferred aromatic tetracarboxylic acid dianhydrides include 3,3',4,4'-biphenyltetracarboxylic dianhydride(s-BPDA), 2,3,3',4'-biphenyltetracarboxylic dianhydride(a-BPDA), pyromellitic dianhydride, benzophenonetetracarboxylic dianhydride, and bis(3,4-dicarboxyphenyl)ether dianhydride (i.e., oxyphthalic dianhydride).

Examples of the aromatic diamines include p-phenylene diamine and 4,4'-diaminodiphenyl ether. A portion of the aromatic diamine can be replaced with an aromatic diamine having plural benzene rings and a flexible structure such as 4,4'-diaminodiphenyl sulfide, 4,4'-diaminobenzophenone, 4,4'-diaminodiphenylmethane, 2,2-bis(4-aminophenyl) propane, 1,3-bis(4-aminophenoxy)benzene, 1,4-bis(4-aminophenoxy)benzene, 4,4'-bis(4-aminophenyl)diphenyl ether, 4,4'-bis(4-aminophenyl)diphenylsulfone, 4,4'-bis(4-aminophenyl)diphenylsulfide, 4,4'-bis(4-aminophenyl) diphenylmethane, 4,4'-bis(4-aminophenoxy)diphenyl ether, 4,4'-bis(4-aminophenoxy)diphenylsulfone, 4,4'-bis(4-aminophenoxy)diphenylsulfide, 4,4'-bis(4-aminophenoxy) diphenylmethane, 2,2-bis[4-(aminophenoxy)phenyl] propane, or 2,2-bis[4-(4-aminophenoxy)phenyl] hexafluoropropane, an aliphatic diamine such as 1,4-diaminobutane, 1,6-diaminohexane, 1,8-diaminooctane, 1,10-diaminodecane, or 1,12-diaminododecane, and other aromatic diamines such as xylylenediamine..

The aromatic polyimide resin preferably has a low linear expansion coefficient such as in the range of $10 \times 10^{-6}$ to $25 \times 10^{-6}$ cm/cm/° C., in the temperature range of 50 to 250° C. The aromatic polyimide resin having such low linear expansion coefficient can be prepared from a combination of 3,3',4,4'-biphenyltetracarboxylic dianhydride and p-phenylene diamine, a combination of a mixed aromatic tetracarboxylic acid components such as a mixture of pyromellitic dianhydride, 3,3',4,4'-biphenyltetracarboxylic dianhydride and benzophenonetetracarboxylic dianhydride, and p-phenylene diamine (hereinafter referred to as PPD) alone or a mixed diamine components such as a mixture of PPD and 4,4'-diaminodiphenyl ether (hereinafter referred to as DADE). PPD and DADE are preferably employed in a molar ratio of 100/0 to 15/85 (PPD/DADE). The polyimide can be in any form of a homopolymer, a random copolymer and a block copolymer. The polyimide can also be prepared by separately producing two or more kinds of polyamide acids, mixing these polyamide acids, and heating the mixed polyamide acids to give a polyimide film.

The polyimide resin matrix is preferably produced from a polyimide precursor, namely, polyamide acid or polyamic acid, which can be prepared by reacting in an organic solvent an aromatic tetracarboxylic acid component with an aromatic diamine component in an approximately equimolar ratio at a temperature of lower than approx. 100° C., preferably 0 to 60° C. The reaction mixture containing the resulting polyimide precursor (i.e. polyamide acid) may contain a small portion of its corresponding polyimide. The reaction mixture containing the polyamide acid is then employed as a dope solution.

The dope solution is casted on an appropriate support and heated to a temperature of 70 to 200° C. to give a self-supporting dry film of polyamide acid. The dry film is then separated from the support.

The dry polyamide acid film can be produced by known simultaneous coextrusion of two or more polyamide acid solutions.

The organic solvent employed for the preparation of polyamide acid can be N-methyl-2-pyrrolidone, N,N-dimethylformamide, N,N-dimethylacetamide, N,N-diethylacetamide, dimethylsulfoxide, hexamethylphosphoramide, or N-methylcaprolactam. These organic solvents can be employed singly or in combination. In the reaction solution, an organic base compound such as imidazole, 2-methylimidazole, 1,2-dimethylimidazole, 2-phenylimidazole, or triethylamine can be incorporated so as to accelerate the desired imidization. The organic base compound can be incorporated into the reaction solution in an amount of 0.1 to 10 weight %, based on the solid content (i.e., polyamide acid) of the solution. Into the reaction solution which can be used as the dope solution, an organic phosphorus compound such as triphenyl phosphite, triphenyl phosphate, or alkyl phosphate can be also incorporated in an amount of 0.05 to 1 weight % (based on the amount of solid content in the reaction solution) so as to facilitate the separation of the dry polyamide acid film from the support. The dope solution may contain an inorganic filler.

On the dry polyamide acid film, which preferably is self-supporting, a palladium compound is placed, for instance, by coating or spraying a solution containing a palladium compound. The coating or spraying solution preferably contains a palladium compound in amount of 0.1 to 5 weight %. The solvent of the solution may be an alcoholic solvent, an acetone solvent, an ethereal solvent, or an amide solvent.

The palladium compound preferably is soluble in the solvent of the dope solution which still remains in the dry polyamide acid film. Examples of the palladium compounds include carboxylic acid salts of palladium, and palladium dihalide. The carboxylic acid preferably contains 6 to 30 carbon atoms, more preferably 6 to 10 carbon atoms, in its molecular structure. Examples of the carboxylic acids include aliphatic acids. Most preferred is a palladium resinate [e.g., $Pd(OCOC_8H_{17})_2$], which is available from Degussa AG.

The coated or sprayed Pd compound-containing solution is permeated into the surface layer of the polyamide acid film.

The polyamide acid film having been coated or sprayed with a Pd compound-containing solution is then heated to a temperature of 370° C. or higher, preferably a temperature of 420 to 520° C., preferably for 2 to 30 min., to convert the polyamide acid to polyimide. Thus prepared polyimide film preferably has a thickness of approx. 7 to 125 µm, more preferably approx. 10 to 125 µm. The palladium compound permeated into the surface layer is generally converted into palladium metal or other palladium compound. A ratio of thickness between the surface layer containing the palladium metal or palladium compound and other portion of the resulting polyimide film containing neither palladium metal nor palladium compound preferably is 0.05:100 to 2:100.

Alternatively, the palladium compound can be incorporated into the polyamide acid film by simultaneous extruding method, for instance, extruding an aromatic polyimide precursor solution containing no palladium compound and an aromatic polyimide precursor solution containing a palladium compound from a die simultaneously and placing one extruded precursor solution on the other precursor solution to give a combined precursor solution film. The simultaneous extrusion of polyamide acid solutions is described in Japanese Patent Publication H7-102661. The coextruded polyamide acid solutions are dried and heated to a temperature of 370° C. or higher, preferably a temperature of 420 to 520° C., preferably for 2 to 30 min., to convert the polyamide acid to a polyimide, so that a polyimide film having a surface layer which contains palladium metal or a palladium compound.

On the polyimide film having a surface layer which contains palladium metal or a palladium compound, a metal film is formed by chemical plating. There is no specific limitation with respect to the chemical plating procedure, and known procedures are employable. For instance, the surface layer of the polyimide film is washed with water, treated with a diluted sulfuric acid (for activation of Pd or acceleration), heated to dryness, allowed for cooling to room temperature, washed again with water, immersed in a plating solution for approx. 10 to 60 min. to plate the surface layer with metal, washed again with water, and dried. The plating solution can be a known chemical plating solution which contains a salt of copper, nickel, tin, gold, silver, or one of their mixture. The plated metal preferably has a thickness of approx. 0.1 to 20 $\mu$m.

On the plated metal layer of the polyimide film can be formed an electrolytically plated metal layer. A known electrolytical plating method can be employed. For instance, the polyimide film having the chemically plated metal layer is immersed in an electrolytic metal salt-containing aqueous acidic solution to form a negative electrode, and a positive electrode is then placed in the solution. An electric current is flowed between these electrodes to deposit metal on the chemically plated metal layer of the polyimide film. The electrolytic metal salt-containing aqueous acidic solution may comprise 50 to 200 g/L (specifically 50 to 100 g/L) of a metal salt such as copper(II) sulfate and 100 to 300/L of sulfuric acid. If desired, a small amount of a brightener can be incorporated. The electrolytic plating can be carried out at a temperature of 20 to 30° C., an negative electrode current density of 2 to 8 A/dm$^2$, a negative electrode efficiency of 95 to 100%, a positive/negative surface area ratio of 1:1, and at a voltage of 6 V or lower, under airy stirring and continuous filtration, using a copper pole as a negative electrode. The metal layer (e.g., a layer of copper, nickel, tin, gold, silver, or one of their mixtures) electrolytically plated on the surface layer of the polyimide film preferably has a thickness of 1 to 30 $\mu$m.

Thus electrolytically plated metal layer is bonded to the surface layer of the polyimide film with high bonding strength and is hardly separated from the polyimide film.

Therefore, the metal-plated polyimide film according to the invention can be favorably employed as material for the preparation of electronic devices such as MCM (Multi Chip Module) and FPC (Flexible Printed Circuit Board).

The present invention is further described by the following Examples.

EXAMPLES 1

(1) Dope Solution for Preparing Polyimide Film

In a 300 mL-volume glass reaction vessel equipped with a stirrer, a nitrogen gas-inlet tube and a reflux condenser, 183 g of N,N-dimethylacetamide and 0.1 g of a phosphoric acid compound (Separ 365-100, available from Chukyo Oil and Fat Co., Ltd.) were placed. The placed N,N-dimethylacetamide and the phosphoric acid compound were stirred in a nitrogen stream, and to the mixture was added 10.81 g (0.1000 mol.) of p-phenylenediamine. The resulting mixture was then warmed to 50° C. to give a homogeneous solution. To the solution was potionwise added 29.229 g (0.09935 mol.) of 3,3',4,4'-biphenyltetracarboxylic dianhydride, taking a care to obviate extreme heat generation. After the addition was complete, the reaction mixture was stirred at 50° C. for 5 hours. Subsequently, 0.2381 g (0.00065 mol.) of 3,3',4,4'-biphenyltetracarboxylic acid dihydrate was dissolved in the resulting solution. To thus produced polyamide acid solution were added 2.4 wt. % (per the amount of polyamide acid) of 1,2-dimethylimidazole and 0.25 wt. % (per the amount of polyamide acid) of an inorganic filler (fine silica particles), to give a dope solution. The dope solution showed a viscosity of approx. 1,500 poise (at 25° C.).

An aromatic polyimide film (thickness: 50 $\mu$m) prepared from the dope solution had a linear thermal expansion coefficient of 12×10$^{-6}$ cm/cm/° C. at a temperature range of 50 to 250° C. The linear expansion coefficient was measured at a temperature elevation rate of 10° C./min.

(2) Preparation of Polyimide Film

The dope solution obtained in (1) above was spread on a glass plate and heated to 150° C. for 10 min. to dryness. The dried polyamide acid film (which was self-supporting) was separated from the glass plate and fixed on a frame. On the fixed polyamide acid film was coated a solution of 2 wt. % palladium resinate (containing Pd(OCOC$_8$H$_{17}$)$_2$), available from Degussa AG] in N,N-dimethylacetamide containing 250 ppm a surface active agent (L7001, available from Nippon Unicar Co., Ltd.). The film was dried at 135° C., and then heated at 200° C. for 2 min., 250° C. for 2 min., and 470° C. for 2 min., sequentially, to give an aromatic polyimide film having a Pd-containing surface layer.

EXAMPLE 2

(1) Preparation of Chemically Copper-plated Film

The Pd-containing surface layer of the polyimide film prepared in Example 1 was washed with water, and the film was immersed in diluted sulfuric acid to activate the exposed surface of the Pd-containing surface layer.

The activated Pd-containing surface layer was washed with water and immersed in a chemical plating solution containing copper sulfate (available from Okuno Pharmaceutical Industry, Co., Ltd.) at 25° C., for 30 min., whereby depositing copper metal on the Pd-containing surface layer. The copper-deposited polyimide film was washed with water and dried by applying gaseous nitrogen, to give a copper-plated polyimide film.

Thus prepared copper-plated polyimide film was observed by means of SEM to confirm that a uniform copper metal layer is plated on the polyimide film.

(2) Evaluation of Plated Copper Metal Layer
1) Cross-cut Test of the Copper Metal layer The chemically copper-plated polyimide film was cut to give 100 square chips (1 mm×1 mm). On the chip was placed an adhesive tape (Scotch Tape, available from 3M corporation), and the 90° peeling test was performed.

The peeling strength (90° peel) was 2.8 to 3.0 kg/cm.
2) Acid Resistance

The chemically copper-plated polyimide film was immersed in 2N hydrochloric acid for 30 min. Thus treated film was subjected to the cross-cut test. It was confirmed that the acid treatment did not give essential change of the adhesion of the plated copper metal layer to the polyimide film.

EXAMPLE 3

Electrolytic Plating on the Copper-plated Polyimide Film

The chemically copper-plated polyimide film prepared in Example 2 was immersed in an aqueous electrolytic plating solution containing 90 g/L of copper sulfate, 200 g/L of sulfuric acid, and a small amount of a brightener, and an electrolytic plating procedure was carried out at a temperature of 25° C., an negative electrode current density of 580 A/dm$^2$, a positive electrode/negative electrode surface area ratio of 1:1, to give an electrolytically copper-plated film. The plated copper metal has a uniform surface.

EXAMPLE 4

The polyimide film having a Pd-containing surface layer was prepared in the same manner as in Example 1 using a 1.0 wt. % palladium chloride in dimethylacetamide in place of the Pd resinate-dimethylacetamide solution.

On the Pd-containing surface layer of the polyimide film was subjected to the same chemical copper-plating procedure as in Example 2. A chemically copper-plated polyimide film having enough bonding strength between the polyimide film and the plated copper metal layer was obtained. However, the uniformness of the plated copper metal layer is relatively poor, as compared with that observed in Example 2.

EXAMPLE 5

The polyimide film having a Pd-containing surface layer was prepared in the same manner as in Example 1 using a 1.0 wt. % palladium acetate in dimethylacetamide in place of the Pd resinate-dimethylacetamide solution.

On the Pd-containing surface layer of the polyimide film was subjected to the same chemical copper-plating procedure as in Example 2. A chemically copper-plated polyimide film having enough bonding strength between the polyimide film and the plated copper metal layer was obtained. However, the uniformness of the plated copper metal layer is relatively poor, as compared with that observed in Example 2.

EXAMPLE 6

The polyimide film having a Pd-containing surface layer on both surface sides was prepared :in the same manner as in Example 1.

On the both Pd-containing surface layers of the polyimide film was plated chemically a copper metal layer in the same manner as in Example 2. The produced polyimide film having a chemically copper-plated layer on both surface sides was examined by the cross cut test, before and after the acid treatment. Almost the same results as in Example 2 were obtained.

On the both chemically plated copper layers of the polyimide was plated electrolytically a copper metal layer in the same manner as in Example 3. The electrolytically plated copper-layer placed on both surface sides of the polyimide film had a uniform surface.

EXAMPLE 7

A polyamide acid dope solution containing no palladium compound (i.e., dope solution for core layer) was prepared in the same manner as in Example 1. A palladium compound-containing dope solution for surface layer was prepared by incorporating 1.0 wt. % of palladium resinate into the palladium free dope solution. One portion of the dope solution for core layer and two,portions of the dope solution for surface layer were simultaneously extruded from a die to form a three-layer dope solution film, in the manner as described in Japanese Patent Publication H7-102661. The three-layer dope solution film was dried to give a dry film and heated, in the same manner as in Example 1, to give a polyimide film (thickness: 50 μm) having a Pd-containing surface layer on both surface sides.

On the both Pd-containing surface layers of the polyimide film was plated chemically a copper metal layer in the same manner as in Example 2. The produced polyimide film having a chemically copper-plated layer on both surface sides was examined by the cross cut test, before and after the acid treatment. Almost the same results as in Example 2 were obtained.

On the both chemically plated copper layers of the polyimide was plated electrolytically a copper metal layer in the same manner as in Example 3. The electrolytically plated copper-layer placed on both surface sides of the polyimide film had a uniform surface.

EXAMPLES 8 TO 10

The polyimide film having a Pd/Al-containing surface layer on both surface sides was prepared in the same manner as in Example 6, except that the surfaces of the polyamide acid film were coated with 1 wt. % of Pd resinate and 1 wt. % (for Example 8), (or 0.5 wt. % for Example 9, or 0.1 wt. % for Example 1) of aluminum triacetylacetonate in isopropyl alcohol.

On the both Pd/Al-containing surface layers of the polyimide film was plated chemically a copper metal layer in the same manner as in Example 2. The produced polyimide film having a chemically copper-plated layer on both surface sides was examined by the cross cut test before the acid treatment. The 90° peel strength was as much as 3.5 kg/cm. No essential change was observed by the acid treatment.

On the both chemically plated copper layers of the polyimide was plated electrolytically a copper metal layer in the same manner as in Example 3. The electrolytically plated copper-layer placed on both surface sides of the polyimide film had a uniform surface which was superior to the surface condition of the copper plated layer of the polyimide film obtained in Example 6.

What is claimed is:

1. A metal-plated aromatic polyimide film comprising an aromatic polyimide resin film, a surface layer of which contains a palladium metal or a palladium compound dispersed therein, and a metal layer which is chemically plated on the surface layer of the polyimide resin film.

2. The metal-plated aromatic polyimide film of claim 1, wherein an aluminum metal or an aluminum compound is further contained in the surface layer of the aromatic polyimide resin film.

3. The metal-plated aromatic polyimide film of claim 1, wherein the surface layer containing a palladium metal or a palladium compound is formed by placing a palladium compound on a self-supporting film of an aromatic polyimide precursor and heating the self-supporting film having the palladium compound thereon to a temperature at which the polyimide precursor is converted into its corresponding aromatic polyimide.

4. The metal-plated aromatic polyimide film of claim 3, wherein the palladium compound placed on the self-supporting film is a palladium dicarboxylate, each carboxylate having 6 to 10 carbon atoms.

5. The metal-plated aromatic polyimide film of claim 3, wherein the palladium compound placed on the self-supporting film is palladium resinate.

6. The metal-plated aromatic polyimide film of claim 1, wherein the surface layer containing a palladium metal or a palladium compound is formed by coating or spraying a solution of a palladium compound on a self-supporting film of an aromatic polyimide precursor and heating the self-supporting film having the palladium compound thereon to a temperature at which the polyimide precursor is converted into its corresponding aromatic polyimide.

7. The metal-plated aromatic polyimide film of claim 6, wherein the palladium compound placed on the self-supporting film is a palladium dicarboxylate, each carboxylate having 6 to 10 carbon atoms.

8. The metal-plated aromatic polyimide film of claim 6, wherein the palladium compound placed on the self-supporting film is palladium resinate.

9. The metal-plated aromatic polyimide film of claim 1, wherein the surface layer containing a palladium metal or a palladium compound is formed by extruding an aromatic polyimide precursor solution containing no palladium compound and an aromatic polyimide precursor solution containing a palladium compound simultaneously from a die and placing one extruded precursor solution on the other precursor solution to give a combined precursor solution film, and heating the precursor solution film to a temperature at which the polyimide precursor is converted into its corresponding aromatic polyimide.

10. The metal-plated aromatic polyimide film of claim 9, wherein the palladium compound placed on the self-supporting film is a palladium dicarboxylate, each carboxylate having 6 to 10 carbon atoms.

11. The metal-plated aromatic polyimide film of claim 9, wherein the palladium compound contained in the aromatic polyimide precursor solution is palladium resinate.

12. The metal-plated aromatic polyimide film of claim 1, wherein the aromatic polyimide resin film comprises an aromatic polyimide resin produced from a combination of 3,3',4,4'-biphenyltetracarboxylic dianhydride and p-phenylenediamine.

13. The metal-plated aromatic polyimide film of claim 1, wherein the aromatic polyimide resin film has, on the side opposite to the surface layer containing a palladium metal or a palladium compound, another surface layer containing a palladium metal or a palladium compound dispersed therein, on which another chemically plated metal layer is placed.

14. The metal-plated aromatic polyimide film of claim 1, wherein an electrolytically plated metal layer is formed on the chemically plated metal layer.

* * * * *